(12) United States Patent
Chen et al.

(10) Patent No.: US 10,672,776 B2
(45) Date of Patent: *Jun. 2, 2020

(54) MEMORY CIRCUIT HAVING RESISTIVE DEVICE COUPLED WITH SUPPLY VOLTAGE LINE

(71) Applicant: TAIWAN SEMICONDUCTOR MANUFACTURING COMPANY, LTD., Hsinchu (TW)

(72) Inventors: Yen-Huei Chen, Jhudong Township (TW); Hung-Jen Liao, Hsin-Chu (TW); Chih-Yu Lin, Taichung (TW); Jonathan Tsung-Yung Chang, Hsinchu (TW); Wei-Cheng Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/458,970

(22) Filed: Jul. 1, 2019

(65) Prior Publication Data

US 2019/0326302 A1    Oct. 24, 2019

Related U.S. Application Data

(60) Continuation of application No. 15/864,873, filed on Jan. 8, 2018, now Pat. No. 10,373,964, which is a
(Continued)

(51) Int. Cl.
*G11C 11/00* (2006.01)
*H01L 27/11* (2006.01)
(Continued)

(52) U.S. Cl.
CPC ........ *H01L 27/1112* (2013.01); *G11C 11/412* (2013.01); *G11C 11/419* (2013.01);
(Continued)

(58) Field of Classification Search
CPC ..... G11C 11/412; G11C 11/419; G11C 5/025; G11C 5/14; H01L 27/1112;
(Continued)

(56) References Cited

U.S. PATENT DOCUMENTS

| 5,726,562 A | 3/1998 | Mizuno |
| 6,724,648 B2 | 4/2004 | Khellah et al. |

(Continued)

FOREIGN PATENT DOCUMENTS

CN    103377685    10/2013

OTHER PUBLICATIONS

Office Action dated Aug. 31, 2017 from corresponding application No. TW 105140938.
Office Action dated Aug. 2, 2019 from corresponding application No. CN 201611187332.0.

*Primary Examiner* — Pho M Luu
(74) *Attorney, Agent, or Firm* — Hauptman Ham, LLP

(57) ABSTRACT

A memory circuit including: a first column of memory cells, each memory cell of the first column including a first supply segment; a first supply voltage line in a first conductive layer, the first supply voltage line being made of at least the first supply segments of the first column; a second supply voltage line; a first resistive device electrically connecting the first and second supply voltage lines, and being located in a via layer; a first material, from which the first resistive device is formed, being different than a second material from which a first type of via plug in the via layer is formed; and a supply voltage source electrically coupled with first supply voltage line through one or more conductive paths, and the second supply voltage line and the first resistive device being in a lowest resistance path of the one or more conductive paths.

20 Claims, 12 Drawing Sheets

Related U.S. Application Data division of application No. 14/995,403, filed on Jan. 14, 2016, now Pat. No. 9,865,605.

(51) Int. Cl.

| | |
|---|---|
| *H01L 49/02* | (2006.01) |
| *G11C 11/412* | (2006.01) |
| *G11C 11/419* | (2006.01) |
| *H01L 23/522* | (2006.01) |
| *H01L 23/528* | (2006.01) |
| *H01L 23/532* | (2006.01) |
| *G11C 5/02* | (2006.01) |
| *G11C 5/14* | (2006.01) |

(52) U.S. Cl.
CPC ........ *H01L 23/528* (2013.01); *H01L 23/5226* (2013.01); *H01L 23/5228* (2013.01); *H01L 23/53209* (2013.01); *H01L 23/53257* (2013.01); *H01L 28/00* (2013.01); *G11C 5/025* (2013.01); *G11C 5/14* (2013.01)

(58) Field of Classification Search
CPC ............ H01L 23/5226; H01L 23/5228; H01L 23/528; H01L 23/53209; H01L 23/53257
See application file for complete search history.

(56) References Cited

U.S. PATENT DOCUMENTS

| | | | |
|---|---|---|---|
| 6,891,745 B2 | 5/2005 | Liaw | |
| 7,113,421 B2 | 9/2006 | Maeda et al. | |
| 7,502,275 B2 | 3/2009 | Nii et al. | |
| 7,764,535 B2 | 7/2010 | Nguyen | |
| 8,004,907 B2 | 8/2011 | Russell et al. | |
| 8,446,754 B2 | 5/2013 | Kim | |
| 8,605,523 B2 | 12/2013 | Tao et al. | |
| 8,630,132 B2 | 1/2014 | Cheng et al. | |
| 8,811,068 B1 | 4/2014 | Clark et al. | |
| 8,760,948 B2 | 6/2014 | Tao et al. | |
| 9,305,642 B2 * | 4/2016 | Oh | G11C 13/003 |
| 9,520,178 B2 * | 12/2016 | Iyer | G11C 11/412 |
| 9,767,891 B2 | 9/2017 | Zhang | |
| 9,865,605 B2 * | 1/2018 | Chen | G11C 11/412 |
| 10,373,964 B2 * | 8/2019 | Chen | G11C 11/419 |
| 2006/0274571 A1 | 12/2006 | Maeda et al. | |
| 2013/0272056 A1 | 10/2013 | Liaw | |
| 2014/0032871 A1 | 1/2014 | Hsu et al. | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |

\* cited by examiner

MEMORY CIRCUIT HAVING RESISTIVE DEVICE COUPLED WITH SUPPLY VOLTAGE LINE

PRIORITY CLAIM

The present application is a continuation of U.S. application Ser. No. 15/864,873, filed Jan. 8, 2018, now U.S. Pat. No. 10,373,964, issued Aug. 6, 2019, which is a divisional of U.S. application Ser. No. 14/995,403, filed Jan. 14, 2016, now U.S. Pat. No. 9,865,605, granted Jan. 9, 2018, the entireties of each of which are incorporated herein by reference.

BACKGROUND

The semiconductor integrated circuit (IC) industry has produced a wide variety of digital devices to address issues in a number of different areas. Some of these digital devices are electrically configured as static random access memory (SRAM) cells for the storage of digital data. In some applications in a write operation, a data line is set to carry a voltage level corresponding to a first logic value. The data line is then coupled with the SRAM cell through a pass gate device. While the pass gate device is pulling a data node of the SRAM cell to the first logic value, a pulling device of the SRAM cell is also pulling the data node toward a voltage level corresponding to a second logic value. As ICs have become smaller and more complex, in some embodiments, the circuit designers face a trade-off between a higher SRAM density and proper balance of pulling capabilities among various pulling devices. However, the balance of pulling capabilities as contemplated by the circuit designers is affected by manufacturing process variations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
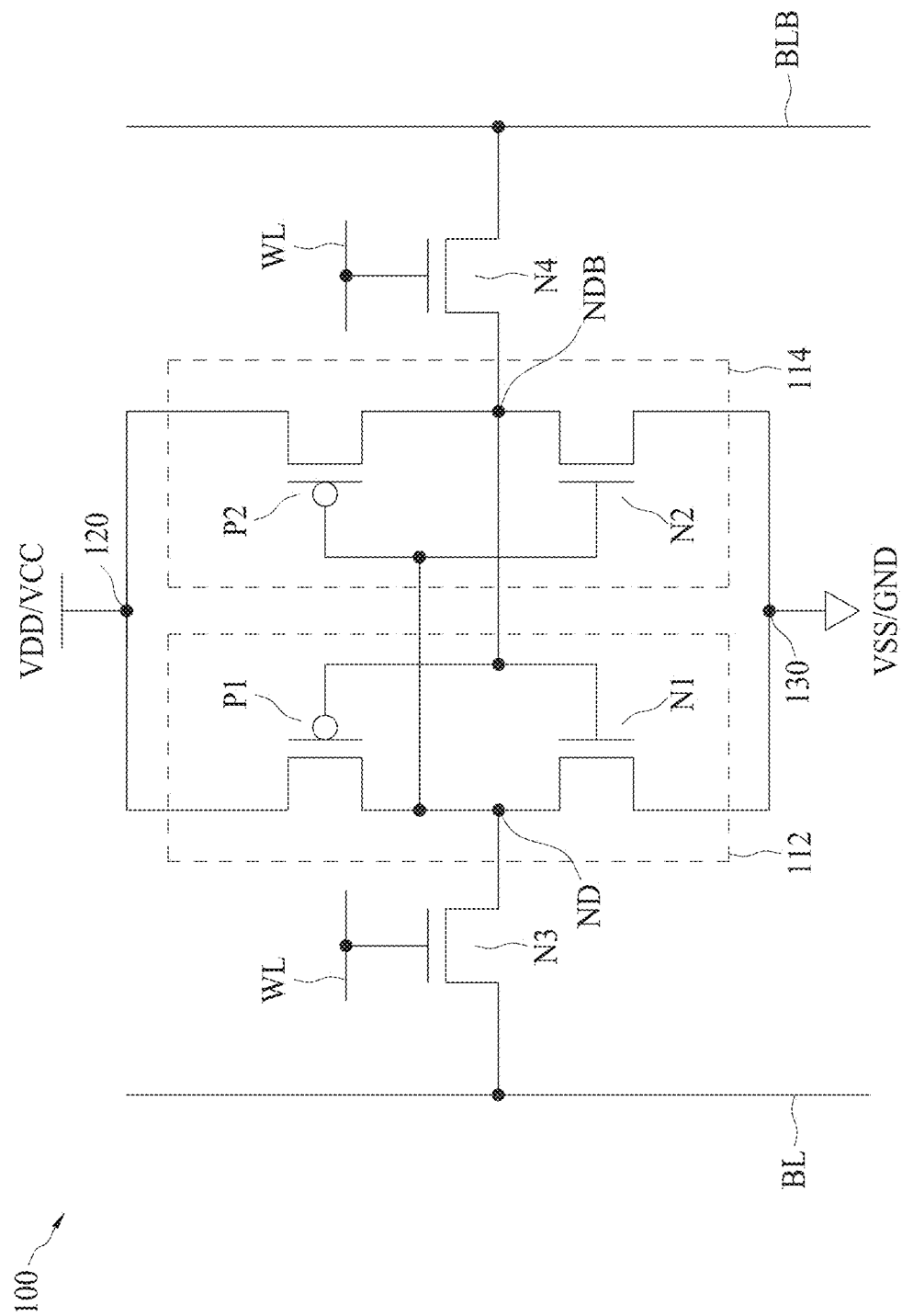
FIG. 1 is a schematic circuit diagram of a static random access memory (SRAM) cell, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a resistive device is disposed between a supply voltage line of a memory cell and a supply voltage source. The supply voltage source is configured to provide a supply voltage having a supply voltage level. The resistive device is usable to limit a driving capability of a pulling device of the memory cell that is set to pull a data node of the memory cell toward the supply voltage level. In some embodiments, the weakened driving capability of the pulling device helps to lower a minimum operation voltage level of the supply voltage sufficient to cause the memory cell to function normally.

FIG. 1 is a schematic circuit diagram of a static random access memory (SRAM) cell 100, in accordance with some embodiments. In some embodiments, a plurality of memory cells 100 is arranged in rows and columns of a memory array. Various embodiments regarding incorporating a resistive device in a memory circuit will be illustrated in conjunction with FIGS. 2-10 based on memory cell 100 in FIG. 1.

SRAM cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or cross-coupled inverters. Transistors P1 and N1 form a first inverter 112 while transistors P2 and N2 form a second inverter 114. Drains of transistors P1 and N1 are coupled together and form a node ND. Drains of transistors P2 and N2 are coupled together and form a node NDB. Gates of transistors P1 and N1 are coupled together and to drains of transistors P2 and N2. Gates of transistors P2 and N2 are coupled together and to drains of transistors P1 and N1.

Sources of transistors P1 and P2 are coupled to a first supply voltage node 120. Transistors P1 and P2 are configured as pulling devices for pulling voltage levels at nodes ND or NDB toward a voltage level of first supply voltage node 120. Sources of transistors N1 and N2 are coupled to a second supply voltage node 130. Transistors N1 and N2 are configured as pulling devices for pulling voltage levels at nodes ND or NDB toward a voltage level of second supply voltage node 130. In some embodiments, first supply voltage node 120 is configured to receive a first supply voltage having a first supply voltage level. In some embodiments, the first supply voltage level is also called VDD or VCC. In some embodiments, the first supply voltage level corresponds to a logic high value. In some embodiments, second supply voltage node 130 is configured to receive a second supply voltage having a second supply voltage level. In some embodiments, the second supply voltage level is also called VSS or GND. In some embodiments, the second supply voltage level is lower than the first supply voltage level and corresponds to a logic low value.

Transistor N3 and transistor N4 are also called pass gate devices. Drains of transistors N3 and N4 are coupled to a pair of bit lines BL and BLB, respectively. Sources of transistors N3 and N4 are coupled to nodes ND and NDB, respectively. In some embodiments, bit lines BL and BLB are coupled with all drains of transistors in a column of SRAM cells that correspond to transistors N3 and N4 in SRAM cell 100. Each of bit lines BL and BLB is also called a data line because the voltage levels carried on bit lines BL and BLB correspond to data read from or to be written to corresponding nodes ND and NDB.

A word line WL is coupled with gates of transistors N3 and N4. In some embodiments, word line WL is coupled with all gates of transistors in a row of SRAM cells that correspond to transistors N3 and N4 in SRAM cell 100. Word line WL is also called a control line because the signal on word line WL controls the on or off state of transistors N3 and N4.

In a read operation of SRAM cell 100, in some embodiments, bit lines BL and BLB are pre-charged to first supply voltage level VDD or VCC. Word line WL is then activated to turn on transistors N3 and N4. After transistors N3 and N4 are turned on, one of transistor N1 or N2 starts to pull the corresponding one of bit lines BL or BLB toward second supply voltage level VSS or GND based on the voltage level of nodes ND or NDB.

In a write operation of SRAM cell 100, in some embodiments, voltage levels corresponding to the data to be written to memory cell 100 are applied to bit lines BL and BLB. Word line WL is then activated to turn on transistors N3 and N4. After transistors N3 and N4 are turned on, one of transistor N3 or transistor N4 functions as a pulling device to pull the corresponding one of nodes ND or NDB toward second supply voltage level VSS or GND based on the voltage level of bit lines BL and BLB.

In some embodiments, transistor N3 and transistor N4 are replaced with PMOS transistors P3 and P4 (not show in FIG. 1). In some embodiments, bit lines BL and BLB are pre-charged to second supply voltage level VSS or GND in a read operation. In some embodiments, one of transistor P3 or transistor P4 functions as a pulling device to pull the corresponding one of nodes ND or NDB toward first supply voltage level VDD or VCC in a write operation.

Figure 2:
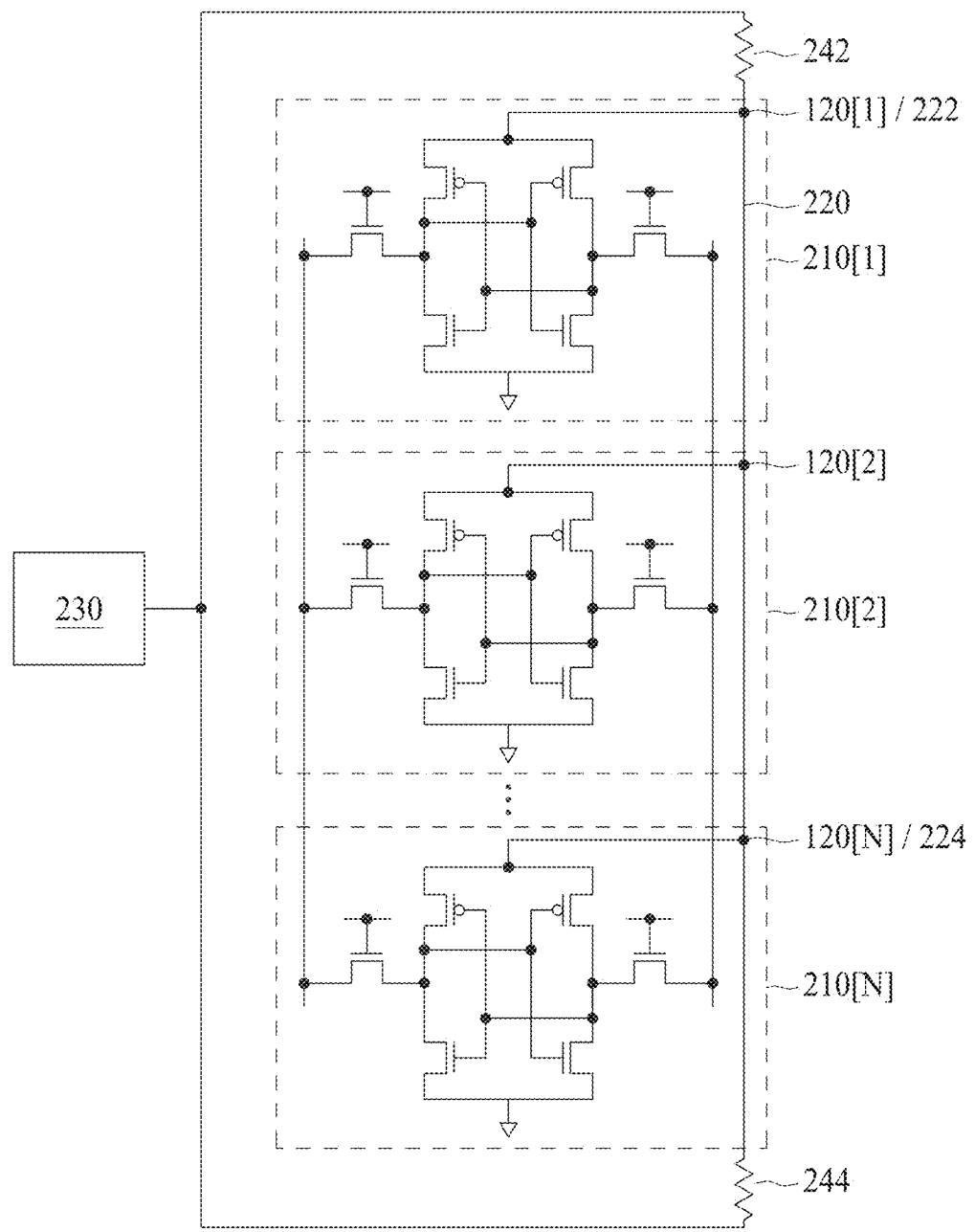
FIG. 2 is a schematic circuit diagram of a portion of a memory circuit including a column of SRAM memory cells, in accordance with some embodiments.

FIG. 2 is a schematic circuit diagram of a portion of a memory circuit 200 including a column of memory cells 210[1], 210[2], and 210[N], in accordance with some embodiments. N is a positive integer equal to or greater than 1. In some embodiments, N ranges from 4 to 512. Each memory cell of memory cells 210[1], 210[2], and 210[N] has a configuration similar to SRAM cell 100, and detailed description thereof is thus omitted.

Memory cells 210[1], 210[2], and 210[N] includes corresponding first supply voltage nodes 120[1], 120[2], and 120[N]. First supply voltage nodes 120[1], 120[2], and 120[N] are electrically coupled together by a conductive path 220, where supply voltage node 120[1] is coupled with a first end 222 of conductive path 220, and supply voltage node 120[N] is coupled with a second end 224 of conductive path 220.

Memory circuit 200 also includes a supply voltage source 230, a first resistive device 242, and a second resistive device 244. The supply voltage source 230 is configured to provide a supply voltage having a supply voltage level VDD/VCC. Supply voltage source 230 is coupled with first end 222 of conductive path 220 through first resistive device 242 and is coupled with second end 224 of conductive path 220 through second resistive device 244. Supply voltage source 230 is electrically coupled with supply voltage nodes 120[1], 120[2], and 120[N] through one or more conductive paths, and first resistive device 242 or second resistive device 244 is in a lowest resistance path of the one or more conductive paths.

In some embodiments, resistive devices 242 and 244 increase the effective turned-on resistance of transistor P1 or transistor P2 of a memory cell 210[1], 210[2], or 210[N] that is selected based on the signals on the corresponding word lines WL. Accordingly, a driving capability of the transistor P1 or transistor P2 of the selected memory cell 210[1], 210[2], or 210[N] is limited by resistive devices 242 and 244. A minimum voltage level (also known as "VCCmin") of supply voltage source 230 that is sufficient to cause memory circuit 200 to read and write normally under a predetermined frequency constraint is lowered with the lowered driving capability of the transistor P1 or transistor P2.

In some embodiments, first resistive device 242 or second resistive device 244 has a resistance value ranging from 1.0 kΩ to 10.0 kΩ. In some embodiments, if the resistance value of first resistive device 242 or second resistive device 244 is lower than 1.0 kΩ, the improvement in performance does not outweigh the increased manufacturing complexity. In some embodiments, if the resistance value of first resistive device 242 or second resistive device 244 is greater than 10.0 kΩ, the improvement in performance does not outweigh the increased area resistive devices 242 and 244 occupy. In some embodiments, first resistive device 242 or second resistive device 244 is made of a material having greater resistivity than the material used to form conductive path 220. For example, in some embodiments, conductive path 220 includes Copper or Aluminum, or other suitable materials, and first resistive device 242 or second resistive device 244 includes Tungsten, Cobalt, polysilicon, doped semiconductor materials, or other suitable materials. In some embodiments, the resistance values of first resistive device 242 or second resistive device 244 are set to avoid lowering the VCCmin value to be lower than a retention voltage level of memory circuit 200.

In some embodiments, when pass gates of memory cells 210[1], 210[2], and 210[N] are PMOS transistors, resistive device 242 or 244 is disposed between the corresponding power node 130 (not labeled) of memory cells 210[1], 210[2], and 210[N] and the supply voltage having voltage level VSS or GND.

Figure 3A:
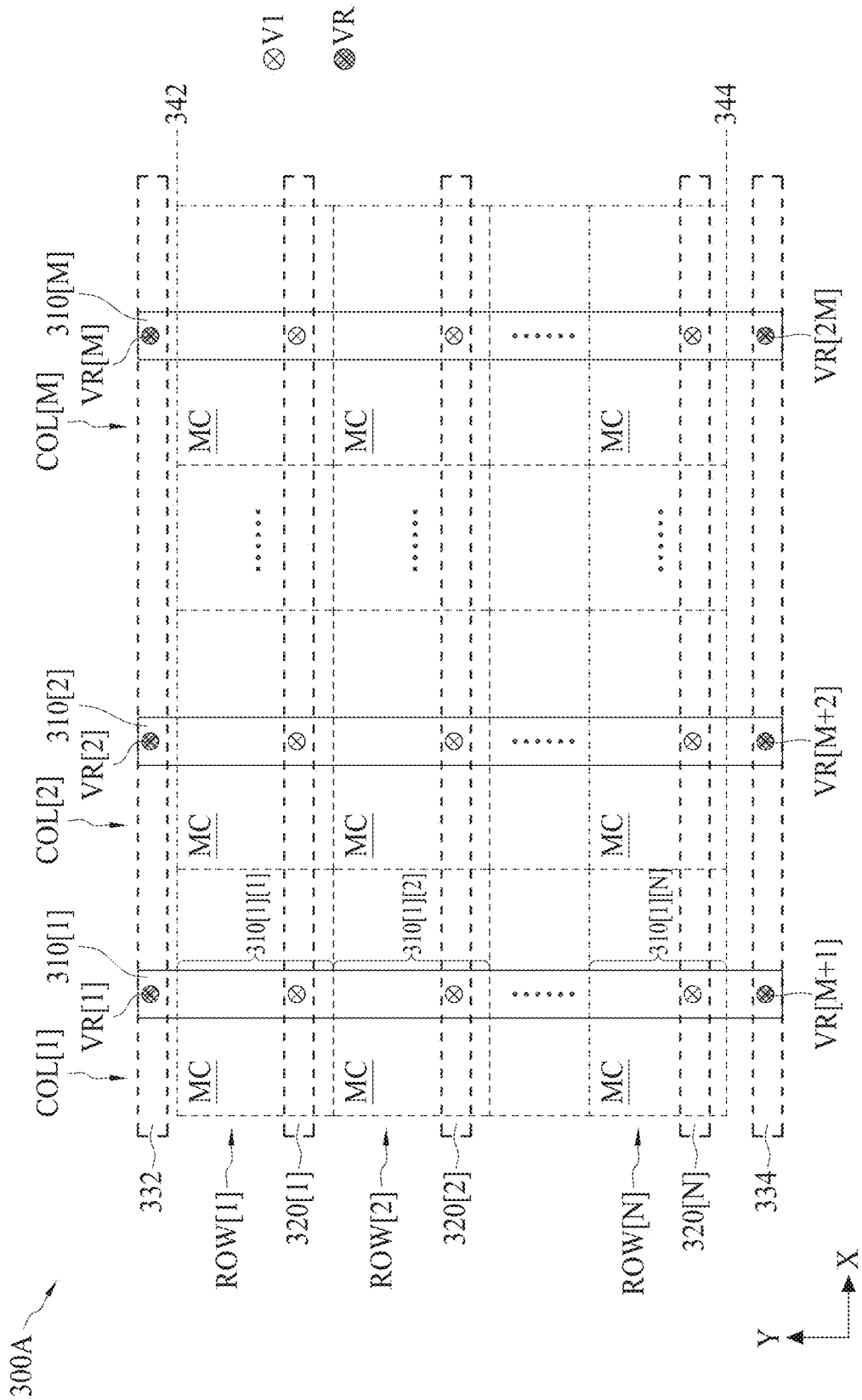
FIGS. 3A and 3B are top views of power supply lines of various memory circuits corresponding to the memory circuit in FIG. 2, in accordance with some embodiments.

FIG. 3A is a top view of power supply lines of a memory circuit 300A corresponding to the memory circuit 200 in FIG. 2, in accordance with some embodiments. FIG. 3A depicts an example implementation of memory circuit 200 in FIG. 2.

Memory circuit 300A includes a memory cell array of M columns COL[1], COL[2], and COL[M] and N rows ROW [1], ROW[2], and ROW[N] of memory cells MC. Each memory cell of memory cells MC has a configuration similar to SRAM cell 100, and detailed depictions thereof are not shown in FIG. 3A. In some embodiments, M and N are positive integers and are equal to or greater than one. In some embodiments, M ranges from 4 to 256. In some embodiments, N ranges from 4 to 512.

Memory circuit 300A also includes supply voltage lines 310[1], 310[2], and 310[M], supply voltage lines 320[1], 320[2], 320[N], 332, and 334, and various via plugs V1 and VR. Supply voltage lines 310[1], 310[2], and 310[M] extend along a direction Y in a first conductive layer of memory circuit 300A. Supply voltage lines 320[1], 320[2], 320[N], 322, and 324 extend along a direction X in a second conductive layer of memory circuit 300A. Via plugs V1 and VR are in a via layer of memory circuit 300A. In some embodiments, the via layer is above the first conductive layer, and the second conductive layer is above the via layer. Other details of memory circuit 300A are not depicted in FIG. 3A.

Supply voltage lines 310[1], 310[2], and 310[M] and supply voltage lines 320[1], 320[2], 320[N] are electrically connected by various via plugs V1 to form a power supply mesh. Supply voltage lines 310[1], 310[2], and 310[M] and supply line 332 are electrically connected by a first set of via plugs VR (VR[1], VR[2], and VR[M]) near one end 342 of the memory cell array. Supply voltage lines 310[1], 310[2], and 310[M] and supply line 334 are electrically connected by a second set of via plugs VR (VR[M+1], VR[M+2], and VR[2M]) near another end 344 of the memory cell array.

A via plug VR has a resistance value greater than a via plug V1. In some embodiments, via plugs VR is made of a material having greater resistivity than the material used to form via plugs V1. In some embodiments, via plugs V1 includes Copper or Aluminum, or other suitable materials. In some embodiments, via plugs VR include Tungsten or Cobalt, or other suitable materials. In some embodiments, all via plugs VR have the same material. In some embodiments, different via plugs VR have different materials.

Memory cells MC of column COL[1] are arranged along direction X. Memory cells MC of column COL[1] correspond to SRAM cells 210[1], 210[2], and 210[N] in FIG. 2. Each memory cell MC of column COL[1] has a corresponding supply voltage line segment 310[1][1], 310[1][2], or 310[1][N]. Each supply voltage line segment 310[1][1], 310[1][2], or 310[1][N] corresponds to first supply voltage node 120[1], 120[2], or 120[N] of the corresponding memory cell 210[1], 210[2], or 210[N]. Supply voltage line 310[1] is made of at least supply voltage line segment 310[1][1], 310[1][2], or 310[1][N]. Via plug VR[1] functions as a resistive device corresponding to resistive device 242. Via plug VR[M+1] functions as a resistive device corresponding to resistive device 244.

Each column of column COL[2] and column COL[M] has a configuration similar to the configuration of column COL [1] illustrated above. Memory cells MC of column COL[2] have corresponding supply voltage line segments, and supply voltage line 310[2] includes these supply voltage line segments of column COL[2]. Via plug VR[2] functions as a resistive device corresponding to resistive device 242 for column COL[2]. Via plug VR[M+2] functions as a resistive device corresponding to resistive device 244 for column COL[2]. Memory cells MC of column COL[M] have corresponding supply voltage line segments, and supply voltage line 310[M] includes these supply voltage line segments of column COL[2]. Via plug VR[M] functions as a resistive device corresponding to resistive device 242 for column COL[M]. Via plug VR[2M] functions as a resistive device corresponding to resistive device 244 for column COL[M].

Figure 3B:
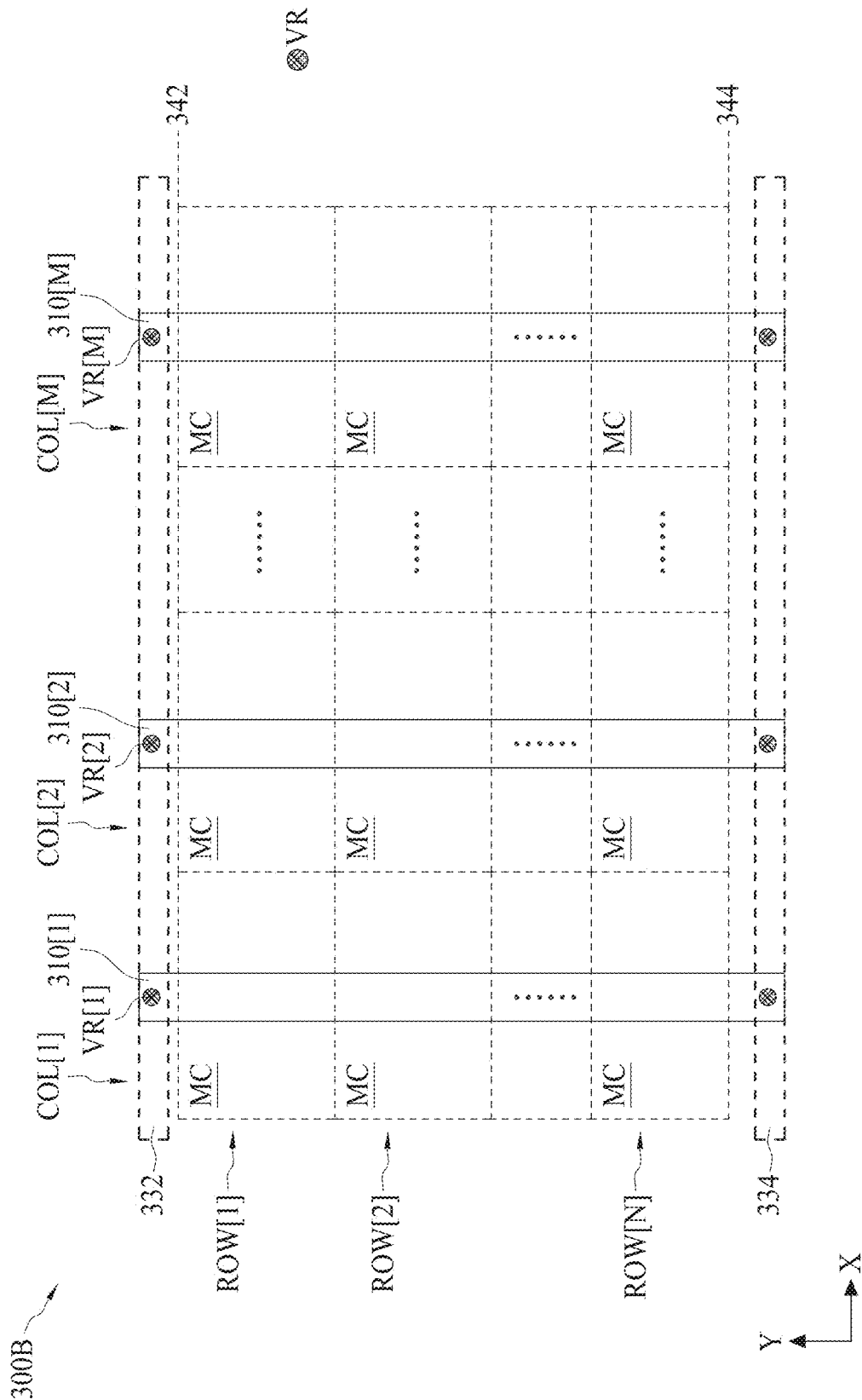

FIG. 3B is a top view of power supply lines of a memory circuit 300B corresponding to the memory circuit 200 in FIG. 2, in accordance with some embodiments. FIG. 3B depicts another example implementation of memory circuit 200 in FIG. 2. Components in FIG. 3B that are the same or similar to those in FIG. 3A are given the same reference numbers, and detailed description thereof is thus omitted.

Compared with memory circuit 300A, memory circuit 300B does not have the supply voltage lines corresponding to supply voltage lines 320[1], 320[2], and 320[M] and the corresponding via plugs V1. In some embodiments, not all supply voltage lines 320[1], 320[2], and 320[M] are omitted in a memory circuit.

Figure 4:
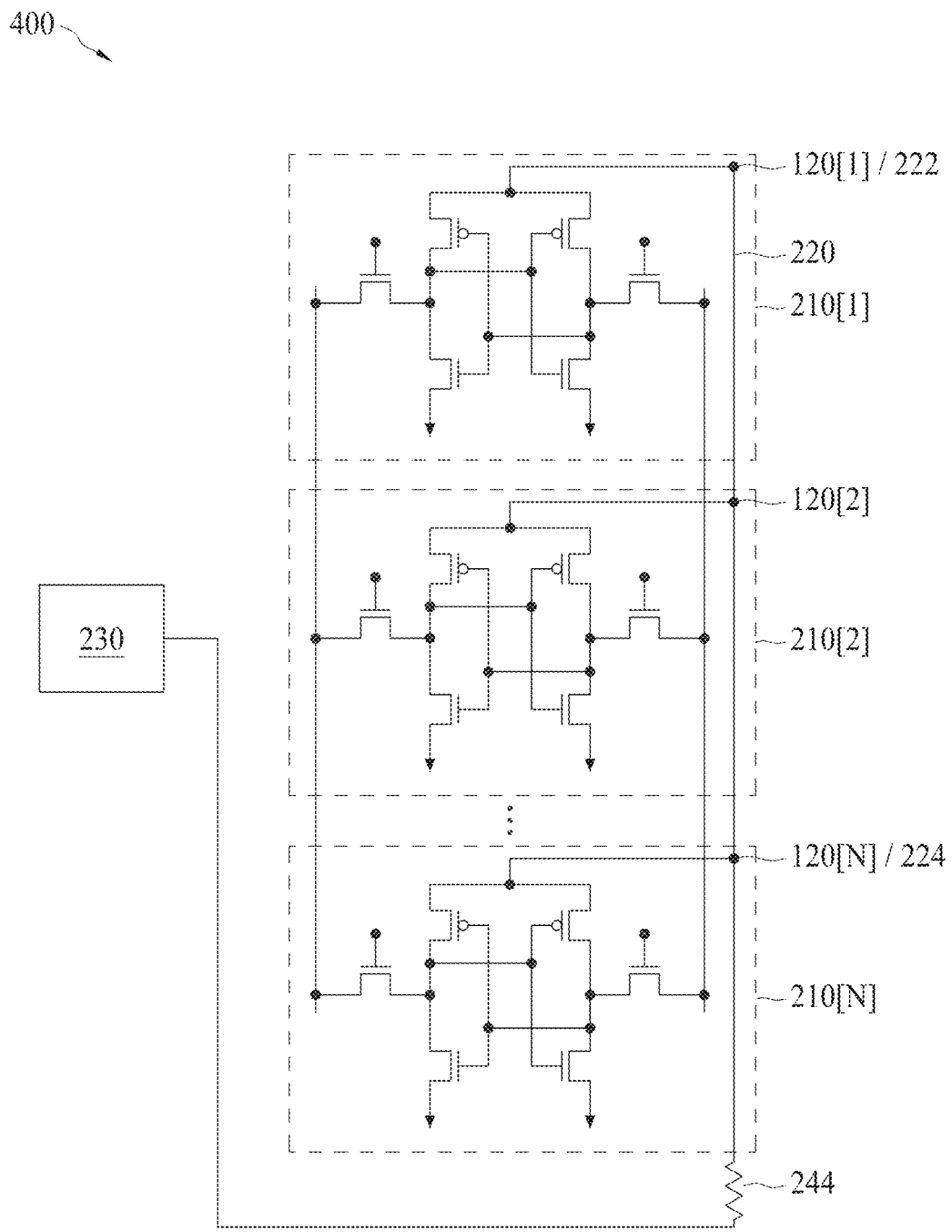
FIG. 4 is a schematic circuit diagram of a portion of another memory circuit including a column of SRAM memory cells in accordance with some embodiments.

FIG. 4 is a schematic circuit diagram of a portion of another memory circuit 400 including a column of SRAM memory cells in accordance with some embodiments. Components in FIG. 4 that are the same or similar to those in FIG. 2 are given the same reference numbers, and detailed description thereof is thus omitted.

Compared with memory circuit 200, memory circuit 400 does not have resistive device 242 connecting first end 222 of conductive path 220 and supply voltage source 230.

Figure 5A:
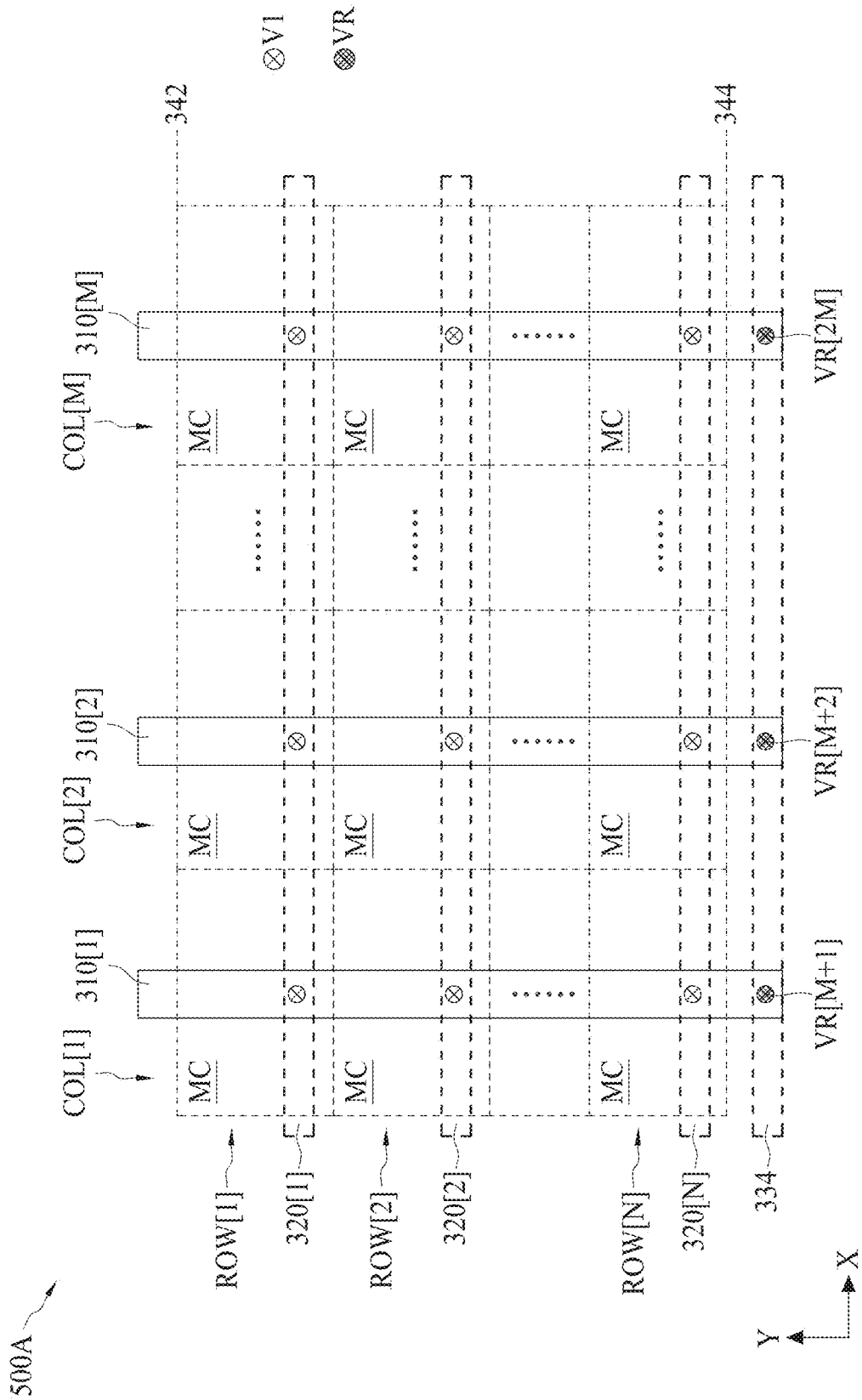
FIGS. 5A and 5B are top views of power supply lines of various memory circuits corresponding to the memory circuit in FIG. 4, in accordance with some embodiments.

FIG. 5A is a top view of power supply lines of a memory circuit 500A corresponding to the memory circuit 400 in FIG. 4, in accordance with some embodiments. FIG. 5A depicts an example implementation of memory circuit 400 in FIG. 4. Components in FIG. 5A that are the same or similar to those in FIG. 3A are given the same reference numbers, and detailed description thereof is thus omitted.

Compared with memory circuit 300A, memory circuit 500A does not have the supply voltage line corresponding to supply voltage line 332 and the corresponding via plugs VR[1], VR[2], and VR[M].

Figure 5B:
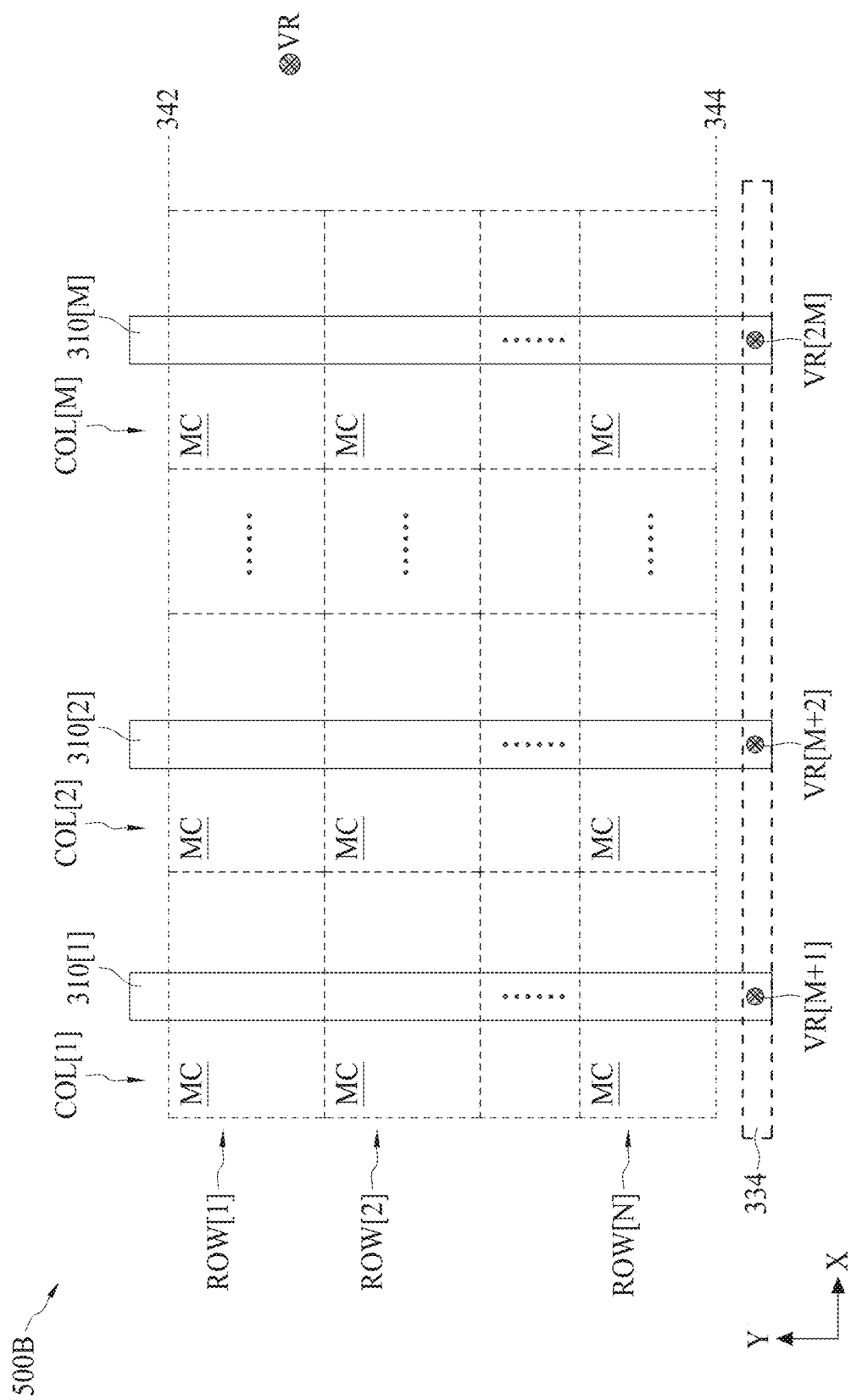

FIG. 5B is a top view of power supply lines of a memory circuit 500B corresponding to the memory circuit 400 in FIG. 4, in accordance with some embodiments. FIG. 5B depicts another example implementation of memory circuit 400 in FIG. 4. Components in FIG. 5B that are the same or similar to those in FIG. 5A are given the same reference numbers, and detailed description thereof is thus omitted.

Compared with memory circuit 500A, memory circuit 500B does not have the supply voltage lines corresponding to supply voltage lines 310[1], 310[2], and 310[M]. In some embodiments, not all supply voltage lines 310[1], 310[2], and 310[M] are omitted in a memory circuit.

Figure 6:
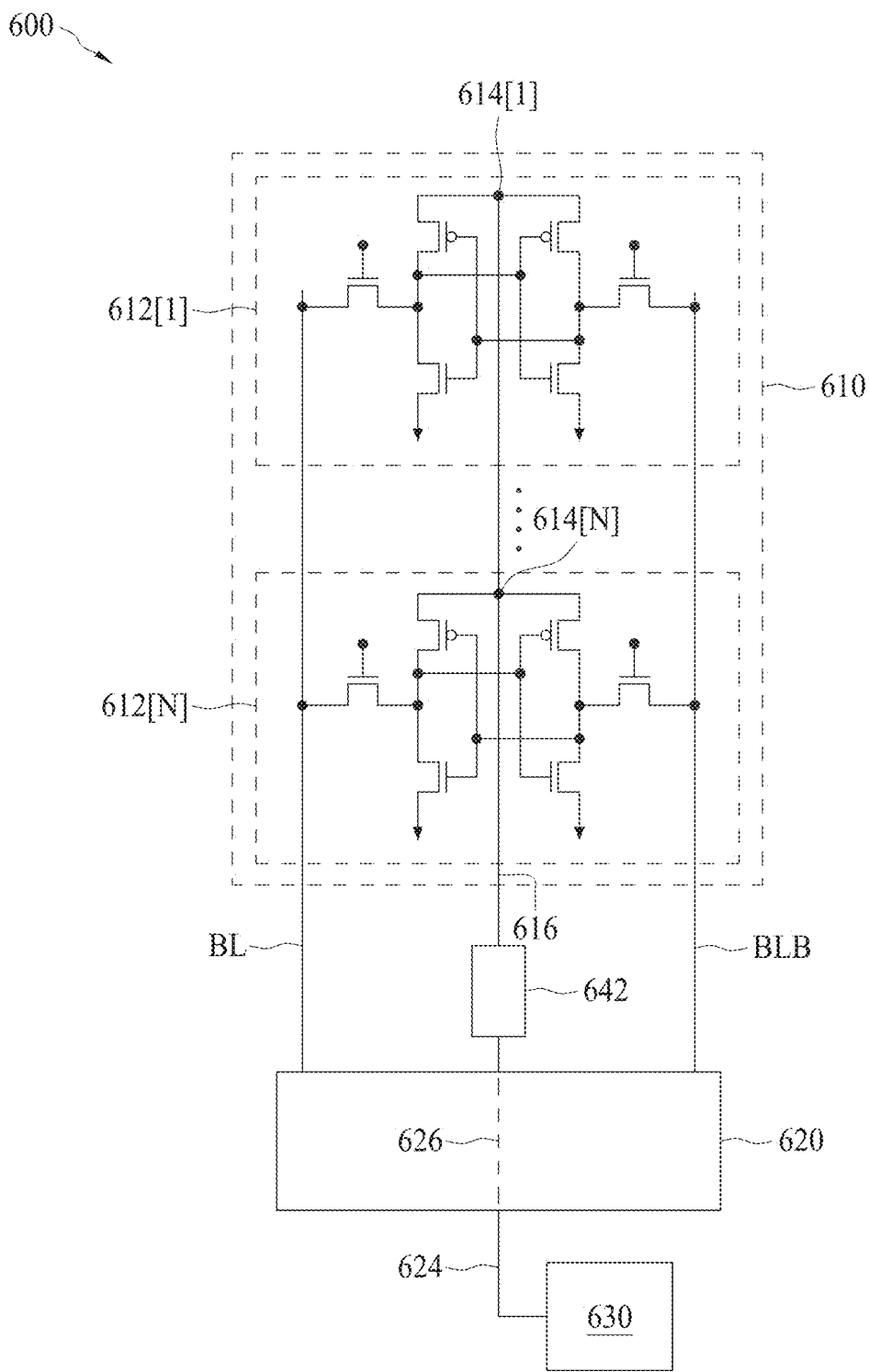
FIG. 6 is a schematic circuit diagram of a portion of a memory circuit including a column of SRAM memory cells and a portion of a read/write circuit, in accordance with some embodiments.

FIG. 6 is a schematic circuit diagram of a portion of a memory circuit 600 including a column of SRAM memory cells 610 and a portion of a read/write circuit 620, in accordance with some embodiments. Memory circuit 600 also includes a supply voltage source 630. The supply voltage source 630 is configured to provide a supply voltage having a supply voltage level VDD/VCC.

The column of memory cells 610 includes memory cells 612[1] and 612[N]. N is a positive integer equal to or greater than 1. In some embodiments, N ranges from 4 to 512. Each memory cell of memory cells 612[1] and 612[N] has a configuration similar to SRAM cell 100, and detailed description thereof is thus omitted. Memory cells 612[1] and 612[N] includes supply voltage nodes 614[1] and 614[N] corresponding to first supply voltage node 120 in FIG. 1. The column of memory cells 610 further includes a conductive path 614 electrically connecting supply voltage nodes 614[1] and 614[N]. Moreover, the column of memory cells 610 includes bit lines BL and BLB corresponding to bit lines BL and BLB in FIG. 1.

Read/write circuit 620 is electrically coupled with bit lines BL and BLB. Also, read/write circuit 620 is electrically coupled with conductive path 616 through a resistive device 642 and with supply voltage source 630 through a conductive path 624. Resistive device 642 is electrically coupled with conductive path 624 through a conductive path 626 within read/write circuit 620. In some embodiments, supply voltage source 630 is coupled with supply voltage nodes 614[1] and 614[N] through one or more conductive paths, and resistive device 642 is in a lowest resistance path of the one or more conductive paths.

In some embodiments, resistive device 642 increases the effective turned-on resistance of transistor P1 or transistor P2 of a memory cell 614[1] or 614[N] that is selected based on the signals on the corresponding word lines WL in a manner similar to the operation of resistive devices 242 or 244 in FIG. 2. Accordingly, a driving capability of the transistor P1 or transistor P2 of the selected SRAM cell 614[1] or 614[N] is limited by resistive device 642. A minimum voltage level (also known as "VCCmin") of supply voltage source 630 that is sufficient to cause memory circuit 600 to read and write normally under a predetermined frequency constraint is lowered with the lowered effective driving capability of the transistor P1 or transistor P2.

In some embodiments, resistive device 642 has a resistance value ranging from 1.0 kΩ to 10.0 kΩ. In some embodiments, if the resistance value of resistive device 642 is lower than 1.0 kΩ, the improvement of the performance does not outweigh the increased manufacturing complexity. In some embodiments, if the resistance value of resistive device 642 is greater than 10.0 kΩ, the improvement of the performance does not outweigh the increased area resistive device 642 occupy. In some embodiments, resistive device 642 is made of a material having greater resistivity than the material used to form conductive path 616 or 624. In some embodiments, resistive device 642 is a conductive line formed in a via layer of memory circuit 600. In some embodiments, resistive device 642 is made of a material including Tungsten or Cobalt. In some embodiments, resistive device 642 is a well resistor or a polysilicon resistor. In some embodiments, the resistance values of resistive device 642 is set to avoid lowering the VCCmin value to be lower than a retention voltage level of memory circuit 600.

Figure 7:
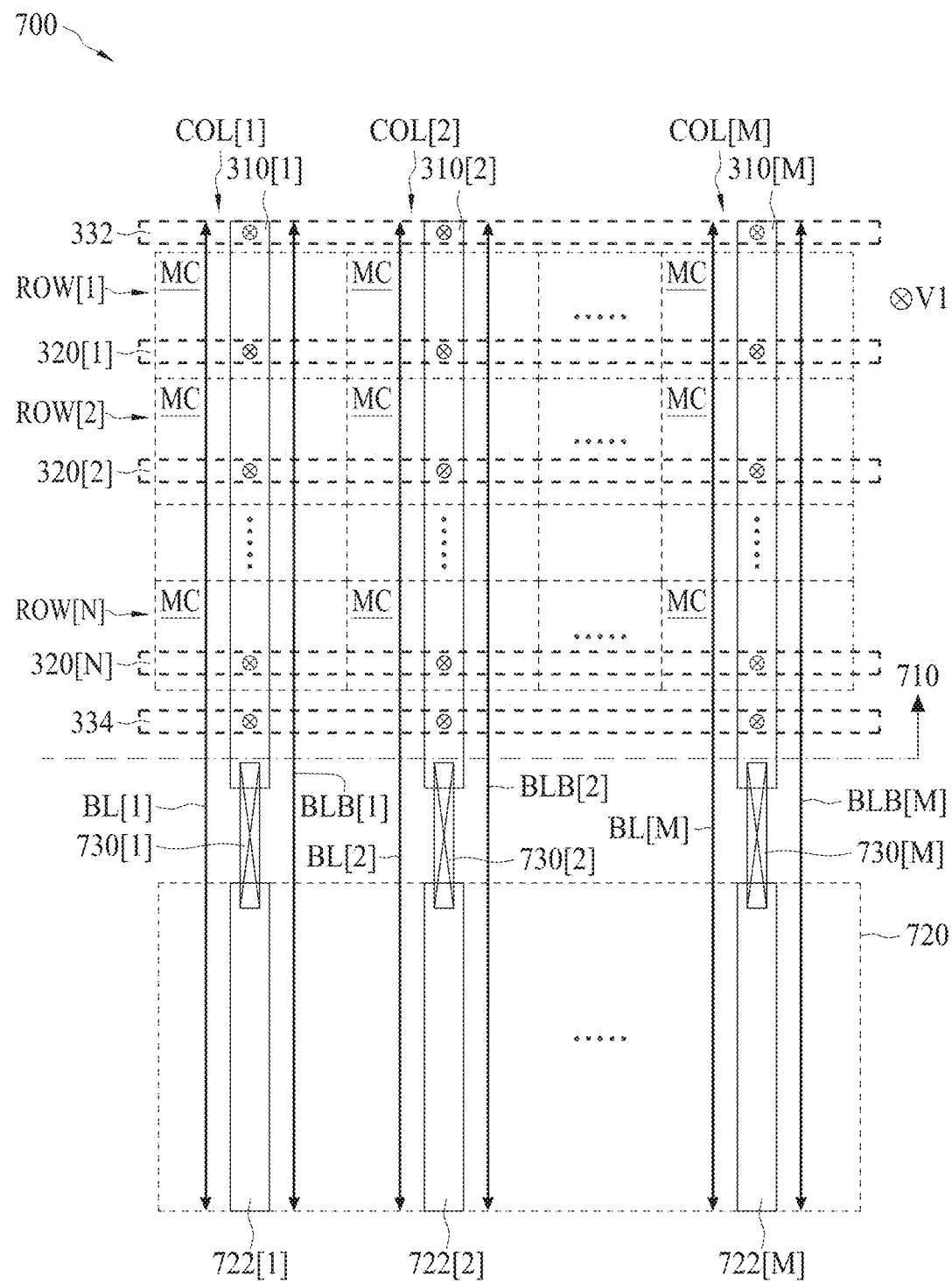
FIG. 7 is a top view of power supply lines of the memory circuit corresponding to memory circuit in FIG. 6, in accordance with some embodiments.

FIG. 7 is a top view of power supply lines of the memory circuit 700 corresponding to memory circuit 600 in FIG. 6, in accordance with some embodiments. FIG. 7 depicts an example implementation of memory circuit 600 in FIG. 6.

Memory circuit 700 has a memory array 710 similar to the portion of memory circuit 300A depicted in FIG. 3A. Components in FIG. 7 that are the same or similar to those in FIG. 3A are given the same reference numbers, and detailed description thereof is thus omitted. Compared with memory circuit 300A depicted in FIG. 3A, supply voltage lines 310[1], 310[2], and 310[M] and conductive lines 320[1], 320[2], 320[N], 332, and 334 of memory array 710 are electrically connected by various via plugs V1 to form a power mesh for memory cells MC of memory array 710. Other variations with regard to the number of conductive lines 320[1], 320[2], 320[N], 322, and 324, the number of supply voltage lines 310[1], 310[2], and 320[M], and/or the type of via plugs V1 are within the contemplated embodiments.

Memory circuit 700 further includes a read/write circuit 720 and bit lines BL[1], BLB[1], BL[2], BLB[2], BL[N], and BLB[N] running though corresponding column of memory cells MC and read/write circuit 720. Read/write circuit 720 includes conductive lines 722[1], 722[2], and 722[M]. In some embodiments, conductive lines 722[1], 722[2], and 722[M] and supply voltage lines 310[1], 310[2], and 310[M] are at the same conductive layer of memory circuit 700. Conductive line 320[1] is electrically coupled with conductive line 722[1] through a prolonged via structure 730[1]; conductive line 320[2] is electrically coupled with conductive line 722[2] through a prolonged via structure 730[2]; and conductive line 320[M] is electrically coupled with conductive line 722[M] through a prolonged via structure 730[M]. In some embodiments, prolonged via structures 730[1], 730[2], and 730[M] has a length longer than that of a via plug of the same via layer. In some embodiments, the length of prolonged via structures 730[1], 730[2], and 730[M] measurable along a column direction ranges from 50 nm to 150 nm.

In some embodiments, prolonged via structures 730[1], 730[2], and 730[M] and via plugs V1 are at the same via layer of memory circuit 700. In some embodiments, prolonged via structures 730[1], 730[2], and 730[M] and via plugs V1 are at different via layers of memory circuit 700. For example, in some embodiments, prolonged via structures 730[1], 730[2], and 730[M] are in a via layer immediately below the conductive layer where conductive lines 722[1], 722[2], and 722[M] and supply voltage lines 310[1], 310[2], and 310[M] are disposed.

A prolonged via structure 730[1], 730[2], or 730[M] has a resistance value greater than a via plug V1. In some embodiments, prolonged via structures 730[1], 730[2], and 730[M] are made of a material having greater resistivity than the material used to form via plugs V1. In some embodiments, via plugs V1 includes Copper or Aluminum, or other suitable materials. In some embodiments, prolonged via structures 730[1], 730[2], and 730[M] include Tungsten or Cobalt, or other suitable materials. In some embodiments, all prolonged via structures 730[1], 730[2], and 730[M] have the same material. In some embodiments, different prolonged via structures 730[1], 730[2], and 730[M] have different materials.

Figure 8:
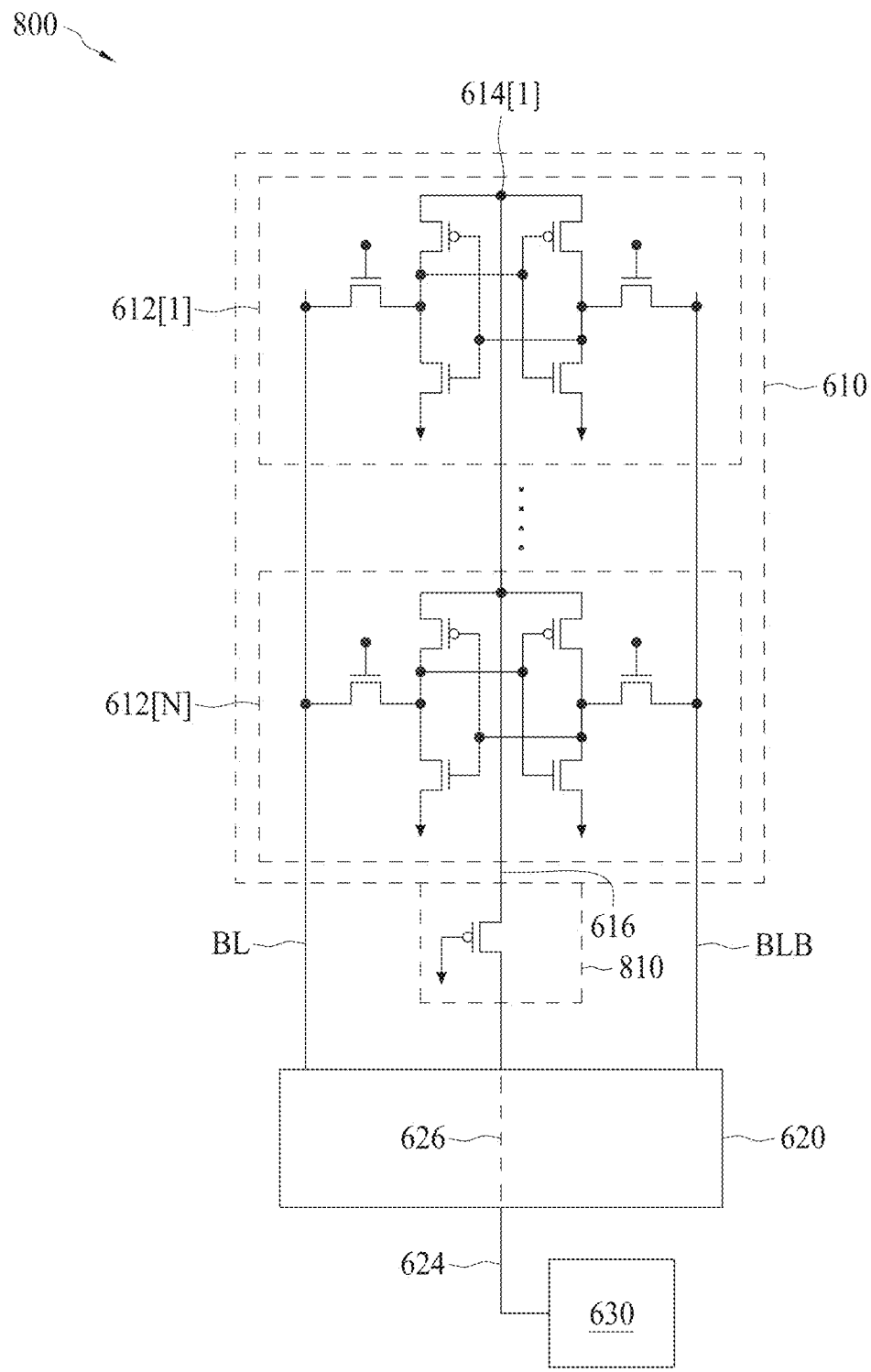
FIG. 8 is a schematic circuit diagram of a portion of another memory circuit including a column of SRAM memory cells and a portion of a read/write circuit, in accordance with some embodiments.

FIG. 8 is a schematic circuit diagram of a portion of another memory circuit 800 including a column of SRAM memory cells 610 and a portion of a read/write circuit, in accordance with some embodiments. Components in FIG. 8 that are the same or similar to those in FIG. 6 are given the same reference numbers, and detailed description thereof is thus omitted.

Compared with memory circuit 600, resistive device 642 is implemented by a transistor device 810 to electrically couple conductive path 616 with conductive path 626 and supply voltage source 630. Transistor device 810 is a P-type transistor having a first source/drain terminal coupled with conductive path 616 and a second source/drain terminal coupled with conductive path 626. Transistor device 810 has a gate terminal configured to receive a voltage level that is sufficient to turn on transistor device 810 during the operation of memory circuit 800. In some embodiments, the channel width, channel length, and doping concentration of transistor device 810 are adjusted to set a turned-on resistance of transistor device 810 to be within the resistance value range of resistive device 642 in FIG. 6.

Transistor device 810 is implemented by a P-type transistor is depicted as an example. In some embodiments, transistor device 810 is implemented by an N-type transistor having a turned-on resistance determined in a manner similar to that illustrated in conjunction with the P-type transistor example.

Figure 9:
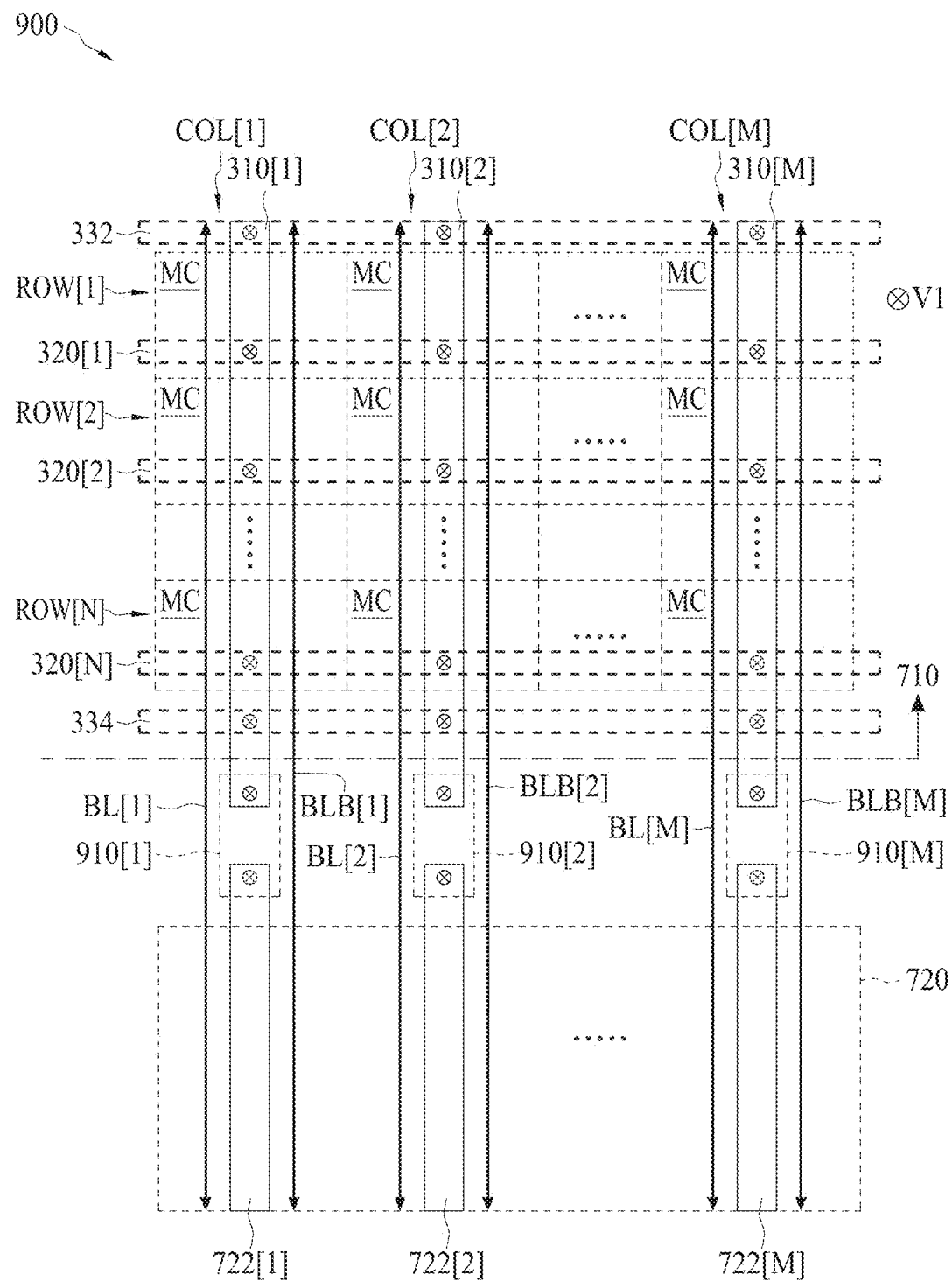
FIG. 9 is a top view of power supply lines of the memory circuit corresponding to memory circuit in FIG. 8, in accordance with some embodiments.

FIG. 9 is a top view of power supply lines of the memory circuit 900 corresponding to memory circuit 800 in FIG. 8, in accordance with some embodiments. FIG. 9 depicts an example implementation of memory circuit 800 in FIG. 8. Components in FIG. 9 that are the same or similar to those in FIG. 7 are given the same reference numbers, and detailed description thereof is thus omitted.

Compared with memory circuit 700, memory circuit 800 does not have the prolonged via structures 730[1], 730[2], and 730[M]. Instead, prolonged via structures 730[1], 730[2], and 730[M] are replaced by transistor devices 910[1], 910[2], and 910[M]. Transistor devices 910[1], 910[2], and 910[M] corresponds to transistor device 810 in FIG. 8 and are electrically coupled with supply voltage lines 310[1], 310[2], and 310[M] and conductive lines 722[1], 722[2], and 722[M] through various via plugs V1 or other interconnection structures.

Compared with memory circuit 700, using transistor devices 910[1], 910[2], and 910[M] to implement resistive device 642 in memory circuit 900 does not require two or more different types of via plugs (e.g., via plugs V1 and VR or the prolonged via structures) to be formed in the via layer where prolonged via structures 730[1], 730[2], and 730[M] are formed. However, in some embodiments compared with memory circuit 700, having transistor devices 910[1], 910[2], and 910[M] increases the overall area occupied by memory circuit 900.

Figure 10:
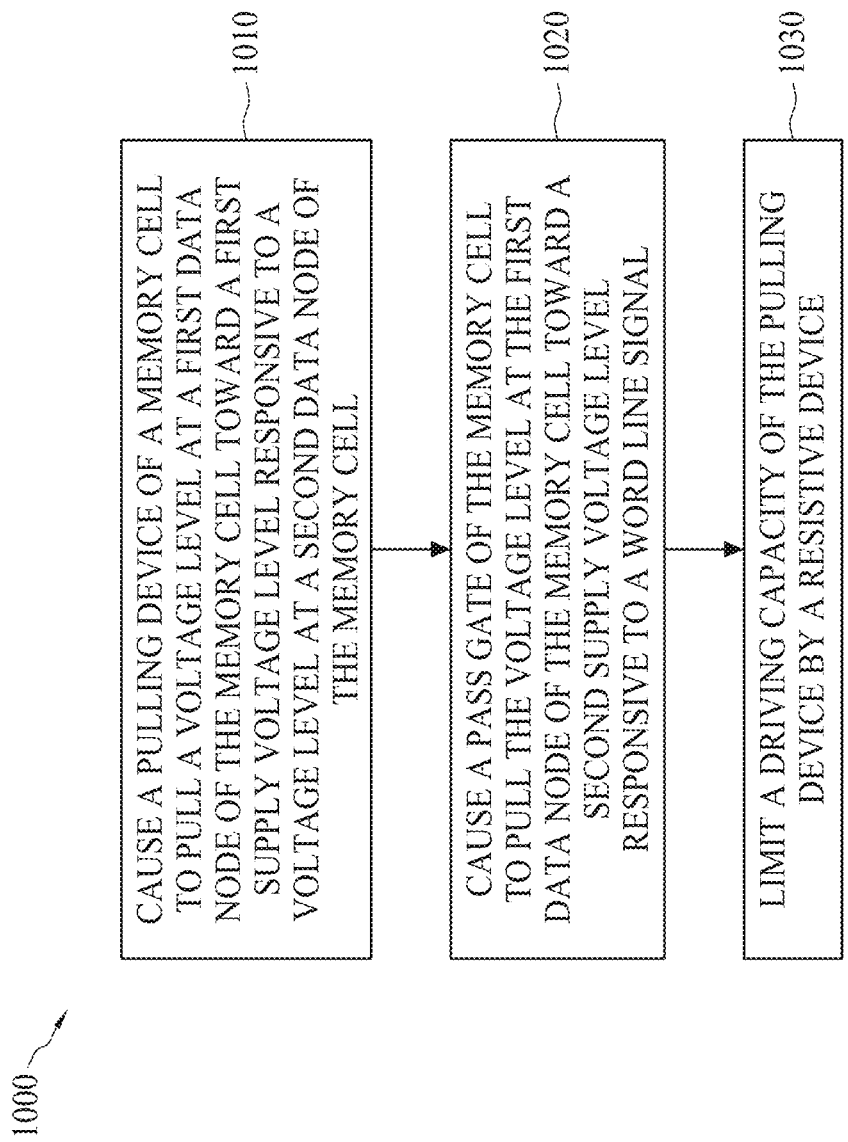
FIG. 10 is a flow chart of a method of writing a memory cell, in accordance with some embodiments.

FIG. 10 is a flow chart of a method 1000 of writing a memory cell, in accordance with some embodiments. In some embodiments, method 1000 is usable to perform write operation on memory cells of memory circuits in FIG. 2, FIG. 4, FIG. 6, or FIG. 8. It is understood that additional operations may be performed before, during, and/or after the method 1000 depicted in FIG. 10, and that some other processes may only be briefly described herein.

Method 1000 is illustrated in conjunction with memory cell 100 FIG. 1 with the presumption that Node ND originally stores a logic value represented by first supply voltage level VDD/VCC, such as a logic high value; and node NDB thus stores a logic value represented by second supply voltage level VSS/GND, such as a logic low value. In the example used to illustrate method 1000, a logic low value will be written to node ND and a logic high value will be written to node NDB. Other combinations of stored logic values and to-be-written logic values are within various embodiments.

Method 1000 begins with operation 1010, where a pulling device of the memory cell, such as transistor P1 in memory cell 100, is caused to pull a voltage level at a first data node, such as node ND, of the memory cell toward a first supply voltage level VDD/VCC responsive to a voltage level at a second data node, such as node NDB, of the memory cell. Meanwhile, voltage level of node NDB is also pulled by pulling device, such as transistor N2 in memory cell 100, toward a second supply voltage level VSS/GND responsive to a voltage level at the first data node ND.

The process proceeds to operation 1020, where bit line BL is pull toward second supply voltage level VSS/GND and bit line BLB is pull toward first supply voltage level VDD/VCC. Therefore, bit lines BL and BLB have the voltage levels representing the logic values to be written to node ND and node NDB. Pass gate devices, such as transistors N3 and N4, are turned on responsive to a word line signal on word line WL to electrically couple bit line BL with node ND and bit line BLB with node NDB. Transistor N3 is thus caused to pull the voltage level at the first data node ND of the memory cell 100 toward the second supply voltage level VSS/GND responsive to the word line signal at word line WL.

The process proceeds to operation 1030, where a driving capability of the pulling device, such as transistor P1, is limited by a resistive device, such as resistive device 242 or 244 in FIG. 2, resistive device 244 in FIG. 4, resistive device 642 in FIG. 6, or transistor device 810 in FIG. 8. The resistive device (242, 244, 642, or 810) is electrically coupled between the pulling device P1 and a supply voltage source configured to provide a first supply voltage having the first supply voltage level VDD/VCC.

The channel type of various transistors and supply voltage levels are used as an example. In some embodiments, transistors N3 and N4 are replaced with P-type transistors, and the resistive device is repositioned to be between transistors N1/N2 and supply voltage node 130 to limit a driving capability of transistor N1 or N2.

In an embodiment, a memory circuit including: a first column of memory cells arranged along a first direction, each memory cell of the first column including a first supply segment; a first supply voltage line extending along the first direction in a first conductive layer, the first supply voltage line being comprised of at least the first supply segments of the first column; a second supply voltage line; a first resistive device electrically connecting the first and second supply voltage lines, the first resistive device being located in a via layer; a first material, from which the first resistive device is formed, being different than a second material from which a first type of via plug in the via layer is formed; and a supply voltage source electrically coupled with first supply voltage line through one or more conductive paths, and the second supply voltage line and the first resistive device being in a lowest resistance path of the one or more conductive paths. In an embodiment, the first material includes Tungsten or Cobalt. In an embodiment, the second supply voltage line extends along a second direction, different from the first direction, in a second conductive layer. In an embodiment, the first column of memory cells has a first end and a second end; the second supply voltage line is disposed closer to the first end than the second end; and the first resistive device is disposed closer to the first end than the second end. In an embodiment, the first resistive device represents a second type of via plug in the via layer; and the via layer is formed between the first conductive layer and the second conductive layer. In an embodiment, a second column of memory cells arranged along the first direction, each memory cell of the second column of memory cells including a second supply segment; a third supply voltage line extending along the first direction in the first conductive layer, the third supply voltage line being made of at least the second supply segments of the second column of memory cells; and a second resistive device electrically connecting the third supply voltage line and the second supply voltage line. In an embodiment, the second supply voltage line extends along the first direction in the first conductive layer; and the via layer is adjacent to the first conductive layer. In an embodiment, relative to the first direction, a length of the first resistive device is greater than a length of the first type of via plug. In an embodiment, a resistance value of the first resistive device is greater than the first type of via plug.

In an embodiment, a memory circuit includes: a column of memory cells arranged along a first direction, each memory cell including a first supply segment; a first supply voltage line extending along the first direction in a first conductive layer, the first supply voltage line being comprised of at least the first supply segments; a second supply voltage line extending along a second direction different from the first direction in a second conductive layer; and a first resistive device in a via layer and electrically connecting the first and second supply voltage lines, the second supply voltage line being electrically coupled with the first supply voltage line through one or more conductive paths; the first resistive device being in a lowest resistance path of the one or more conductive paths; and relative to the first direction, a length of the first resistive device being greater than a length of a via plug in the via layer. In an embodiment, the first resistive device is formed of a material including Tungsten or Cobalt. In an embodiment, the column of memory cells has a first end and a second end; the second supply voltage line is disposed closer to the first end than the second end; the first resistive device is disposed closer to the first end than the second end; and the memory circuit further includes a third supply voltage line extending along the second direction in the second conductive layer, the third supply voltage line being disposed closer to the second end than the first end, and a second resistive device electrically connecting the first supply voltage line and the third supply voltage line, the second resistive device is disposed closer to the second end than the first end. In an embodiment, the memory circuit further includes: a supply voltage source electrically coupled with first supply voltage line through the second supply voltage line and the first resistive device. In an embodiment, a resistance value of the first resistive device is greater than the via plug. In an embodiment, the first resistive device is formed of a first material; the via plug is formed of a second material; and the first material is different than the second material. In an embodiment, the length, L, of the first resistive device is in a range as follows: ($\approx$50 nm)$\leq$L$\leq$($\approx$150 nm).

In an embodiment, a memory circuit includes: a column of memory cells arranged along a first direction, each memory cell including a first supply segment; a first supply voltage line extending along the first direction in a first conductive layer, the first supply voltage line being comprised of at least the first supply segments; a second supply voltage line extending along a second direction different from the first direction in a second conductive layer; and a first resistive device in a via layer and electrically connecting the first and second supply voltage lines, the second supply voltage line being electrically coupled with the first supply voltage line through one or more conductive paths; the first resistive device being in a lowest resistance path of the one or more conductive paths; and the first resistive device being a well resistor. In an embodiment, the column of memory cells has a first end and a second end; the second supply voltage line is disposed closer to the first end than the second end; and the first resistive device is disposed closer to the first end than the second end. In an embodiment, the first resistive device has a resistance, R, in a range as follows: ($\approx$1.0 k$\Omega$)$\leq$R$\leq$($\approx$1.0 k$\Omega$). In an embodiment, the first resistive device is formed of a first material; the first supply voltage line is formed of a second material; and the first material has a different resistivity than the second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
   a first column of memory cells arranged along a first direction, each memory cell of the first column including a first supply segment;
   a first supply voltage line extending along the first direction in a first conductive layer, the first supply voltage line being comprised of at least the first supply segments of the first column;
   a second supply voltage line;
   a first resistive device electrically connecting the first and second supply voltage lines, the first resistive device being located in a via layer;
      a first material, from which the first resistive device is formed, being different than a second material from which a first type of via plug in the via layer is formed; and
   a supply voltage source electrically coupled with first supply voltage line through one or more conductive paths, and the second supply voltage line and the first resistive device being in a lowest resistance path of the one or more conductive paths.

2. The memory circuit of claim 1, wherein:
   the first material includes Tungsten or Cobalt.

3. The memory circuit of claim 1, wherein the second supply voltage line extends along a second direction, different from the first direction, in a second conductive layer.

4. The memory circuit of claim 3, wherein:
   the first column of memory cells has a first end and a second end;
   the second supply voltage line is disposed closer to the first end than the second end; and
   the first resistive device is disposed closer to the first end than the second end.

5. The memory circuit of claim 3, wherein:
   the first resistive device represents a second type of via plug in the via layer; and
   the via layer is formed between the first conductive layer and the second conductive layer.

6. The memory circuit of claim 3, further comprising:
   a second column of memory cells arranged along the first direction, each memory cell of the second column of memory cells including a second supply segment;
   a third supply voltage line extending along the first direction in the first conductive layer, the third supply voltage line being made of at least the second supply segments of the second column of memory cells; and
   a second resistive device electrically connecting the third supply voltage line and the second supply voltage line.

7. The memory circuit of claim 1, wherein:
   the second supply voltage line extends along the first direction in the first conductive layer; and
   the via layer is adjacent to the first conductive layer.

8. The memory circuit of claim 1, wherein:
relative to the first direction, a length of the first resistive device is greater than a length of the first type of via plug.

9. The memory circuit of claim 1, wherein a resistance value of the first resistive device is greater than the first type of via plug.

10. A memory circuit, comprising:
a column of memory cells arranged along a first direction, each memory cell including a first supply segment;
a first supply voltage line extending along the first direction in a first conductive layer, the first supply voltage line being comprised of at least the first supply segments;
a second supply voltage line extending along a second direction different from the first direction in a second conductive layer; and
a first resistive device in a via layer and electrically connecting the first and second supply voltage lines, the second supply voltage line being electrically coupled with the first supply voltage line through one or more conductive paths;
the first resistive device being in a lowest resistance path of the one or more conductive paths; and
relative to the first direction, a length of the first resistive device being greater than a length of a via plug in the via layer.

11. The memory circuit of claim 10, wherein:
the first resistive device is formed of a material including Tungsten or Cobalt.

12. The memory circuit of claim 10, wherein:
the column of memory cells has a first end and a second end;
the second supply voltage line is disposed closer to the first end than the second end;
the first resistive device is disposed closer to the first end than the second end; and
the memory circuit further comprises:
a third supply voltage line extending along the second direction in the second conductive layer, the third supply voltage line being disposed closer to the second end than the first end; and
a second resistive device electrically connecting the first supply voltage line and the third supply voltage line, the second resistive device is disposed closer to the second end than the first end.

13. The memory circuit of claim 10, further comprising:
a supply voltage source electrically coupled with first supply voltage line through the second supply voltage line and the first resistive device.

14. The memory circuit of claim 10, wherein:
a resistance value of the first resistive device is greater than the via plug.

15. The memory circuit of claim 10, wherein:
the first resistive device is formed of a first material;
the via plug is formed of a second material; and
the first material is different than the second material.

16. The memory circuit of claim 10, wherein:
the length, L, of the first resistive device is in a range as follows:

$$(\approx 50 \text{ nm}) \leq L \leq (\approx 150 \text{ nm}).$$

17. A memory circuit, comprising:
a column of memory cells arranged along a first direction, each memory cell including a first supply segment;
a first supply voltage line extending along the first direction in a first conductive layer, the first supply voltage line being comprised of at least the first supply segments;
a second supply voltage line extending along a second direction different from the first direction in a second conductive layer; and
a first resistive device in a via layer and electrically connecting the first and second supply voltage lines, the second supply voltage line being electrically coupled with the first supply voltage line through one or more conductive paths;
the first resistive device being in a lowest resistance path of the one or more conductive paths; and
the first resistive device being a well resistor.

18. The memory circuit of claim 17, wherein:
the column of memory cells has a first end and a second end;
the second supply voltage line is disposed closer to the first end than the second end; and
the first resistive device is disposed closer to the first end than the second end.

19. The memory circuit of claim 17, wherein:
the first resistive device has a resistance, R, in a range as follows:

$$(\approx 1.0 \text{ k}\Omega) \leq R \leq (\approx 1.0 \text{ k}\Omega).$$

20. The memory circuit of claim 17, wherein:
the first resistive device is formed of a first material;
the first supply voltage line is formed of a second material; and
the first material has a different resistivity than the second material.

* * * * *